(12) United States Patent
Chen et al.

(10) Patent No.: US 9,355,935 B2
(45) Date of Patent: May 31, 2016

(54) CONNECTING THROUGH VIAS TO DEVICES

(71) Applicant: Taiwan Semiconductor Manufacturing Company, Ltd., Hsin-Chu (TW)

(72) Inventors: Ming-Fa Chen, Taichung (TW); Yu-Young Wang, New Taipei (TW); Sen-Bor Jan, Tainan (TW)

(73) Assignee: Taiwan Semiconductor Manufactruing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/841,517

(22) Filed: Aug. 31, 2015

(65) Prior Publication Data

US 2015/0371928 A1 Dec. 24, 2015

Related U.S. Application Data

(63) Continuation of application No. 14/149,514, filed on Jan. 7, 2014, now Pat. No. 9,123,702, which is a continuation of application No. 13/572,337, filed on Aug. 10, 2012, now Pat. No. 8,624,324.

(51) Int. Cl.
*H01L 29/423* (2006.01)
*H01L 21/28* (2006.01)
(Continued)

(52) U.S. Cl.
CPC ............ *H01L 23/481* (2013.01); *H01L 21/283* (2013.01); *H01L 21/30604* (2013.01); *H01L 21/31111* (2013.01); *H01L 21/76829* (2013.01); *H01L 21/76879* (2013.01); *H01L 21/76895* (2013.01); *H01L 21/76898* (2013.01); *H01L 23/535* (2013.01); *H01L 29/0649* (2013.01);
(Continued)

(58) Field of Classification Search
CPC ............ H01L 23/481; H01L 29/7848; H01L 21/31111; H01L 29/7843; H01L 23/535; H01L 29/0649; H01L 29/41758; H01L 29/66636; H01L 21/30604; H01L 21/76898; H01L 2924/00; H01L 2924/0002; H01L 21/76895; H01L 21/76879; H01L 21/76829; H01L 21/283

See application file for complete search history.

(56) References Cited

U.S. PATENT DOCUMENTS 6,201,278 B1 3/2001 Gardner et al.
7,041,576 B2 5/2006 Pozder et al.
(Continued)

FOREIGN PATENT DOCUMENTS

KR 1020120000748 1/2012
KR 1020120030782 3/2012
(Continued)

*Primary Examiner* — Victor A Mandala
(74) *Attorney, Agent, or Firm* — Slater Matsil, LLP

(57) ABSTRACT

Methods and devices for connecting a through via and a terminal of a transistor formed of a strained silicon material are provided. The terminal, which can be a source or a drain of a NMOS or a PMOS transistor, is formed within a substrate. A first contact within a first inter-layer dielectric (ILD) layer over the substrate is formed over and connected to the terminal. A through via extends through the first ILD layer into the substrate. A second contact is formed over and connected to the first contact and the through via within a second ILD layer and a contact etch stop layer (CESL). The second ILD layer is over the CESL, and the CESL is over the first ILD layer, which are all below a first inter-metal dielectric (IMD) layer and the first metal layer of the transistor.

20 Claims, 5 Drawing Sheets

(51) Int. Cl.

| | | |
|---|---|---|
| *H01L 23/48* | (2006.01) | |
| *H01L 21/283* | (2006.01) | |
| *H01L 21/768* | (2006.01) | |
| *H01L 29/78* | (2006.01) | |
| *H01L 21/306* | (2006.01) | |
| *H01L 21/311* | (2006.01) | |
| *H01L 23/535* | (2006.01) | |
| *H01L 29/06* | (2006.01) | |
| *H01L 29/417* | (2006.01) | |
| *H01L 29/66* | (2006.01) | |

(52) U.S. Cl.
CPC .... *H01L 29/41758* (2013.01); *H01L 29/66636* (2013.01); *H01L 29/7843* (2013.01); *H01L 29/7848* (2013.01); *H01L 2924/0002* (2013.01)

(56) References Cited

U.S. PATENT DOCUMENTS

| | | | |
|---|---|---|---|
| 7,495,335 B2 | 2/2009 | Kuo | |
| 7,799,678 B2 | 9/2010 | Kropewnicki et al. | |
| 7,868,425 B2* | 1/2011 | Kondo | H01L 29/1054 |
| | | | 257/218 |
| 7,960,282 B2 | 6/2011 | Yelehanka et al. | |
| 8,236,688 B2 | 8/2012 | Yelehanka et al. | |
| 8,264,065 B2* | 9/2012 | Su | H01L 23/481 |
| | | | 257/355 |
| 8,624,324 B1 | 1/2014 | Chen et al. | |
| 2005/0173738 A1* | 8/2005 | Kondo | H01L 29/7842 |
| | | | 257/262 |
| 2005/0239241 A1* | 10/2005 | Ouyang | H01L 21/823807 |
| | | | 438/197 |
| 2009/0108363 A1 | 4/2009 | Forbes et al. | |
| 2009/0315154 A1* | 12/2009 | Kirby | H01L 21/743 |
| | | | 257/621 |
| 2010/0130002 A1 | 5/2010 | Dao et al. | |
| 2010/0224876 A1* | 9/2010 | Zhu | H01L 21/76898 |
| | | | 257/52 |
| 2010/0283130 A1 | 11/2010 | Nishio et al. | |
| 2010/0297844 A1 | 11/2010 | Yelehanka et al. | |
| 2011/0018032 A1* | 1/2011 | Kondo | H01L 29/1054 |
| | | | 257/192 |
| 2011/0254165 A1 | 10/2011 | Muranaka | |
| 2011/0318923 A1 | 12/2011 | Park et al. | |
| 2012/0007154 A1 | 1/2012 | Lin et al. | |
| 2012/0043666 A1 | 2/2012 | Park et al. | |
| 2012/0061827 A1 | 3/2012 | Fujita | |
| 2012/0074570 A1 | 3/2012 | Kolb et al. | |
| 2012/0094437 A1 | 4/2012 | Han et al. | |
| 2012/0205806 A1 | 8/2012 | Yelehanka et al. | |
| 2012/0292757 A1 | 11/2012 | Mauder et al. | |
| 2012/0326320 A1* | 12/2012 | Hong | H01L 21/76898 |
| | | | 257/770 |
| 2013/0017642 A1* | 1/2013 | Milgrew | G01N 27/4145 |
| | | | 438/49 |
| 2013/0119543 A1 | 5/2013 | Yu et al. | |
| 2013/0153992 A1 | 6/2013 | Loechelt | |
| 2013/0285125 A1 | 10/2013 | Chen et al. | |

FOREIGN PATENT DOCUMENTS

| | | |
|---|---|---|
| TW | 200614489 | 5/2006 |
| TW | 200642036 | 12/2006 |

* cited by examiner

CONNECTING THROUGH VIAS TO DEVICES

RELATED APPLICATION

This application is a continuation of U.S. patent application Ser. No. 14/149,514, filed on Jan. 7, 2014 and entitled "Connecting Through Vias to Devices" which claims the priority benefit of U.S. patent application Ser. No. 13/572,337, filed on Aug. 10, 2012, now U.S. Pat. No. 8,624,324 issued on Jan. 7, 2014 and entitled "Connecting Through Vias to Devices," which are hereby incorporated herein by reference.

BACKGROUND

Since the invention of the integrated circuit (IC), the semiconductor industry has experienced rapid growth due to continuous improvements in the integration density of semiconductor devices (e.g., transistors, diodes, resistors, capacitors, etc.) and continuous reduction in the critical dimension (CD) of semiconductor devices. With the continuous reduction of the CD of semiconductor devices, the scale of the gate, source and drain of a transistor decreases accordingly, which results in the decrease of carriers that determine the magnitude of the current in the transistor.

In various techniques to improve the performance of transistors, one method is to apply mechanical stress to the channel of a transistor to increase the carrier mobility and to reduce resistance. Strained silicon transistors are a result of the application of such a method.

On the other hand, the integration improvements and reductions on CD of semiconductor devices are essentially two-dimensional (2D) in nature, in that the volume occupied by the integrated devices is essentially on the surface of the semiconductor wafer. Although dramatic improvements in lithography have resulted in considerable improvement in 2D IC formation, there are physical limits to the density that can be achieved in two dimensions.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies are then bonded to a carrier substrate and wire bonds electrically coupled contact pads on each die to contact pads on the carrier substrate.

In a 3D IC, the two dies may be bonded together on top of each other using various means such as through vias, e.g., through silicon vias (TSVs) or through-substrate vias. Generally, a through via is formed by etching a vertical via through a substrate and filling the via with a conductive material, such as copper.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments, like reference numbers are used to designate like elements.

In the following description, embodiments are disclosed in the context of forming a connection between a through silicon via used in forming a three-dimensional integrated circuit (3D IC) and a terminal of a strained silicon transistor of a circuit. The connection is made by contacts formed in a first inter-layer dielectric (ILD) layer over a substrate, a contact etch stop layer (CESL) over the first ILD layer, and a second ILD layer over the CESL, which are all below a first inter-metal dielectric (IMD) layer and the first metal layer of the transistor.

Figure 1:
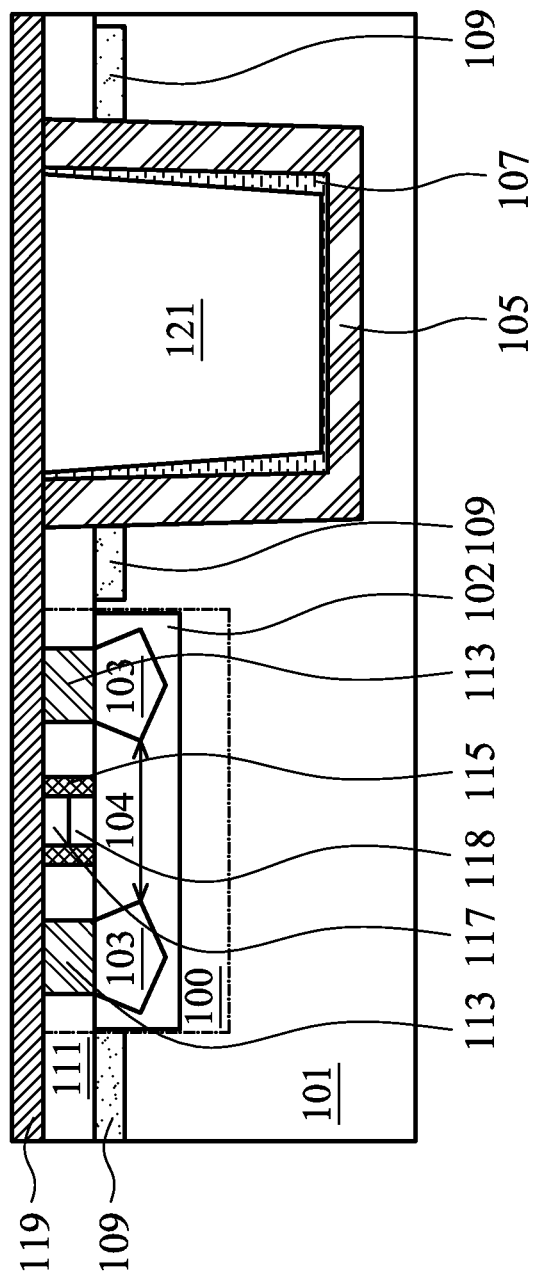
FIGS. 1-5 illustrate various intermediate stages of a process for forming a connection between a strained silicon transistor and a through via in accordance with an embodiment.

As illustrated in FIG. 1, a substrate 101 is provided. The substrate 101 may be a part of a circuit, a device, a die, or a wafer. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer, provided on a substrate, typically a silicon or glass substrate. Other substrates, such as a multi-layered or gradient substrate, or substrates comprising compound semiconductor substrates, e.g., gallium arsenide, or alloy semiconductor substrate, e.g., silicon-germanium, may also be used. The substrate 101 has a front side where a transistor 100 and other devices may be formed, and a backside opposite to the front side.

A plurality of shallow trench isolations (STIs) 109, or other isolation structures, may be formed in the substrate 101 to isolate device regions. The STIs 109 may be formed by etching substrate 101 using photolithography techniques to form recesses. Generally, photolithography involves depositing a photoresist material, which is then masked, exposed, and developed. After the photoresist mask is patterned, an etching process may be performed to remove unwanted portions of the substrate 101. In an embodiment in which the substrate 101 comprises bulk silicon, the etching process may be a wet or dry, anisotropic or isotropic, etch process. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 101. The planarization step may be accomplished, for example, using a chemical mechanical polishing (CMP) process known and used in the art.

A well 102, where the source and drain of a transistor may be formed within, may be formed between two STIs 109. There is only one well 102 shown for one transistor 100 in FIG. 1, while there may be many wells for many transistors in an actual device. In an embodiment, the well 102 may be a p-type well to host the source and drain of a NMOS transistor 100. Alternatively, the well 102 may be an n-type well to host the source and drain of a PMOS transistor 100. In an embodiment, a high temperature thermal procedure may be performed, such as an annealing procedure, to drive and to activate the dopants in the p-type well or the n-type well 102. For example, in an embodiment, the well 102 may be formed by implanting p-type ions, such as boron ions, at a dose of about 1E12 to about 1E14 atoms/cm$^2$ and at an energy of about 20 KeV to about 500 KeV. In an embodiment, the well may have a depth of about 10,000 Å to about 30,000 Å and a width of about 3,000 Å to about 10,000 Å. Other embodiments may utilize different depths, widths, and/or doping parameters.

Two terminals 103 of the transistor 100, which are the source and the drain of the transistor 100, may be formed within the well 102. The transistor 100 may be a NMOS transistor or a PMOS transistor. The region 104 between the two terminals 103 is the channel for the transistor 100. A recess for a terminal 103 may be first etched into the well 102. The etching of the recess may be performed by a dry plasma etching process. In an embodiment, where the substrate 101 is a silicon substrate, the plasma etching process may employ fluorine chemistry. After forming the recess in the well 102, selective epitaxy may be performed to form the terminal 103. A terminal 103 may be either the source or the drain of the transistor 100. The epitaxially grown material for the terminal 103 may be a lattice-mismatched semiconductor material having a different lattice constant from that of the substrate 101 material. The lattice-mismatched material for the terminals 103 may be referred as a strained silicon material.

In an embodiment, the transistor 100 is a PMOS transistor and the lattice-mismatched material, or the strained silicon material for the terminals 103, may be silicon germanium with a composition $Si_{1-x}Ge_x$, where x may be within a range of about 0.1 to about 0.3. In another embodiment, the transistor 100 is an NMOS transistor and the lattice-mismatched material or the strained silicon material for the terminals 103 may be silicon carbon or silicon-germanium-carbon (Si1-x-yGexCy) where the mole fraction of carbon y is greater than a tenth of the mole fraction of germanium x. In an embodiment, the lattice-mismatched material such as silicon germanium may be grown by CVD using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. There may be other ways to grow the silicon germanium or any other strained silicon material for the terminals 103.

The strained silicon material for the terminals 103 is a form of silicon in which a tensile strain is applied to the silicon lattice as a result of the difference in the dimensionalities of the strained silicon lattice and the lattice of the underlying silicon material on which it is formed. In an embodiment, the silicon germanium lattice for the terminals 103 is more widely spaced than a pure silicon lattice for the substrate 101, with the spacing becoming wider as the percentage of germanium increases. Because the silicon lattice aligns with the larger silicon germanium lattice during formation, a tensile strain is formed to the silicon layer for the terminals 103 that the silicon atoms are pulled apart from one another. Consequently, carrier mobility is dramatically increased in strained silicon compared to relaxed silicon, providing a potential increase in mobility of 80% or more for electrons and 20% or more for holes across the channel.

A gate insulating layer 118 may be formed on the surface of the substrate 101. The gate insulating layer 118 may be grown by thermal oxidation, or may be deposited by CVD. In an embodiment, the gate insulating layer 118 may have a thickness of range between about 3 Å and about 50 Å. In an embodiment, a silicon oxide layer may be used as the gate insulating layer for a gate formed of polysilicon material. The gate insulating layer 118 may be another material such as an oxide-nitride-oxide (ONO). In an embodiment, the gate insulating layer 118 may be a high dielectric layer with a dielectric constant that is greater than about 10 and may have a dielectric constant that is from about 15 to about 25. The gate insulating layer 118 may be a material selected from the group consisting of hafnium oxide (HfO), hafnium silicon oxide (HfSiO), hafnium oxide nitride (HfON), and similar materials. In an alternative embodiment, the gate insulating layer 118 may be formed from a material having a relative permittivity greater than about 5. Examples of such materials include aluminum oxide, lanthanum oxide, zirconium oxide, or combinations thereof.

A gate electrode 117 may be formed over the gate insulating layer 118. The thickness of the gate electrode 117 may be in a range between about 500 Å and about 2000 Å. In an embodiment, the gate electrode 117 may comprise polysilicon. In an alternative embodiment, the gate electrode may comprise another material such as polycrystalline silicon germanium. Alternatively, the gate electrode 117 may be a metal gate instead of a polysilicon gate. In one embodiment, the metal gate electrode 117 may comprise hafnium, zirconium, titanium, tantalum, aluminum or an alloy or metal carbide thereof. Metal carbide may be hafnium carbide, zirconium carbide, titanium carbide, tantalum carbide, aluminum carbide or the like. In another embodiment, the metal gate electrode 117 may be formed of a conductive material, such as a metal silicide (e.g., titanium silicide, cobalt silicide, nickel silicide, tantalum silicide), a metal nitride (e.g., titanium nitride, tantalum nitride), doped poly-crystalline silicon or poly-crystalline silicon germanium, or any other conductive materials. Combinations of these materials can be used.

A lithography step may then be performed followed by an etching step using a photoresist mask as an etch mask to form a gate stack comprising the gate insulating layer 118 and the gate electrode 117 as shown in FIG. 1. The etching masks may comprise an antireflective coating (BARC) hard mask layer.

Gate barriers 115 may be formed on the sides of the gate electrode 117 and gate insulating layer 118. In an embodiment, the gate barriers 115 may be formed by CVD of a dielectric material, e.g., silicon oxide or silicon nitride, followed by an anisotropic etching of the dielectric material. In another embodiment, the gate barriers 115 may be a composite barrier comprising a dielectric liner and a barrier body. The dielectric liner may be formed by the deposition of a dielectric liner material, e.g., silicon oxide, and the barrier body material, e.g. silicon nitride, followed by an anisotropic etch using reactive ion etching. In another embodiment, the liner may be an oxide and the barrier body may be a nitride.

A first inter-layer dielectric (ILD) layer 111 may be formed over the substrate 101. The gate stack of the gate insulating layer 118, the gate electrode 117, and the gate barrier 115 may be contained within the first ILD layer 111. The first ILD layer 111 may comprise a low dielectric constant (k value less than about 3.0) or an extreme low dielectric constant (k value less than about 2.5). For example, the first ILD layer 111 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS), as examples. A planarization process, such as a CMP process, may be performed to planarize the first ILD layer 111.

A plurality of contacts 113 may be formed within the first ILD layer 111. The contacts 113 may be formed over the terminals 103, i.e., the source and the drain. Contacts 113 are connected to the terminals 103. Contacts 113 may be formed by, etching recesses from a top surface of the first ILD layer 111 to reach the terminals 103. A thin barrier layer (not shown) may be deposited over the sidewalls of the recesses, such as by CVD, atomic layer deposition (ALD), physical vapor deposition (PVD), thermal oxidation, or a combination thereof. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the recess to form the contacts 113. The conductive material may be formed by an electro-chemical plating process, CVD, ALD, PVD, a combination thereof, and/or the like. The conductive materials may be selected from the group comprising copper, tungsten, aluminum, silver, gold, a combination thereof, and/or the like. The contacts may be formed of a compound comprising a semiconductor material and a metal such as cobalt (Co) or nickel (Ni). Excess conductive material and barrier layer may be removed by, for example, CMP, thereby forming the contacts 113 in connection with the terminals 103.

A through via 121 may be formed between two STIs 109, within the first ILD layer and into the substrate. The through via 121 may be a through silicon via, a through-substrate via, or some other kinds of through via. The through via 121 may be formed by etching an opening from a top surface of the first ILD layer 111 into the substrate 101. The depth of the opening may be in a range of about 10 um~300 um and the width of through via 121 may be in a range of about 1 um~30 um. A liner 105 may be formed over the first ILD layer 111 and the substrate 101 in the opening, covering the sidewalls and bottom of the opening. The liner 105 may be either TEOS or silicon nitride, or any suitable dielectric materials. The liner 105 may be formed using a plasma enhanced chemical vapor deposition (PECVD) process, or other methods such as PVD or a thermal process. A thin barrier layer 107 may be deposited over the liner 105, using methods such as by CVD, ALD, PVD, thermal oxidation, or a combination thereof. The barrier layer 107 may comprise a nitride or an oxynitride, such as titanium nitride, titanium oxynitride, tantalum nitride, tantalum oxynitride, tungsten nitride, or a combination thereof.

A conductive material may be deposited in the opening over the thin barrier layer 107 to form the through via 121. The conductive material may be formed by an electro-chemical plating process, CVD, ALD, PVD, or a combination thereof. The conductive material may be selected from a group consisting copper, tungsten, aluminum, silver, gold, a combination thereof, and/or the like. Excess conductive material and barrier layer may be removed by, for example, CMP, thereby forming the through via 121 as illustrated in FIG. 1.

The through via 121 may be used to connect two dies on top of each other. The through via 121 may be either electrically connected to an electrical device, e.g., such as the transistor 100, or may be electrically coupled to an external electrical connection on the front side of the substrate 101. The through via 121 may act as a pass-through via, allowing devices coupled to the front side of the substrate 101 to electrically communicate to devices coupled to the backside of the substrate 101, or to communicate with devices of a different die.

A contact etch stop layer (CESL) 119 may be formed over the first ILD layer 111, the contacts 113, the gate electrode 117, and the through via 121, to act as a high stress layer. The CESL 119 may be blanket formed of silicon nitride, silicon carbide, silicon oxide, or any other high-stress material. The stress may be compressive or tensile in nature and may have a magnitude in the range of 0.1 to 4 giga-pascals (GPa). The CESL 119 may be formed by a CVD process. The CVD process can be a low-pressure CVD (LPCVD) process or a PECVD process, as commonly known and used in the art. The stress applied on the CESL generates tensile or compressive strain in the channel of the transistor 100 on the semiconductor substrate to improve the carrier mobility further.

Figure 2:
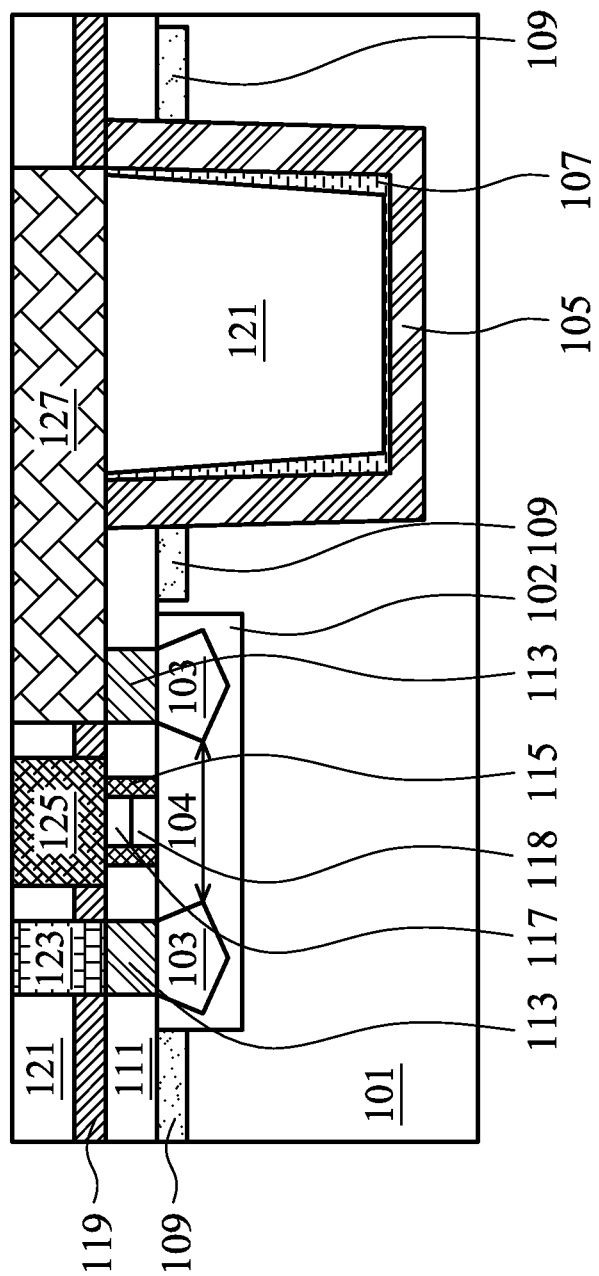

As illustrated in FIG. 2, a second inter-layer dielectric (ILD) layer 121 may be formed over the CESL 119. The second ILD layer 121 may comprise a low dielectric constant (k value less than about 3.0) or an extreme low dielectric constant (k value less than about 2.5). In an embodiment, the second ILD layer 121 may comprise an oxide, $SiO_2$, BPSG, TEOS, SOG, USG, FSG, HDP oxide, or PETEOS. A planarization process, such as a CMP process, may be performed to planarize the second ILD layer 121.

As illustrated in FIG. 2, contacts 123, 125, and 127 may be formed in the second ILD layer 121 and the CESL 119. Openings through the second ILD layer 121 and the CESL 119 may be formed by photolithography techniques by depositing and patterning a photoresist layer to expose a portion of the second ILD layer 121 and the CESL 119 corresponding to the desired position of the openings. Thereafter, the second ILD layer 121 and the CESL 119 may be etched using an anisotropic etching process. The contact 123, 125, and 127 may be formed with a conductive material selected from a group consisting copper, tungsten, aluminum, silver, gold, or a combination thereof. Excessive amounts of the conductive material may be removed from the top surface of the second ILD layer 121 using a planarization process, such as a CMP process.

In an embodiment, the contact 127 is formed over a contact 113 and the through via 121. The contact 127 connects the through via 121 with one contact 113 in the first ILD layer 111, which is further connected to a terminal 103 in the substrate 101. Therefore an electrical connection may be formed between the through via 121 and the terminal 103, going through the contact 127 in the CESL 119 and the second ILD layer 121, and the contact 113 in the first ILD layer 111. The terminal 103 may be the source or the drain of the transistor 100. The contact 125 is connected to the gate electrode 117. The contact 123 is connected to another terminal 103 of the transistor 100. The contact 125 and the contact 123 connect the transistor source or drain, and gate to other part of the circuit, while the contact 127 connects to the through via which may be further connected to devices of other die.

Figure 3:
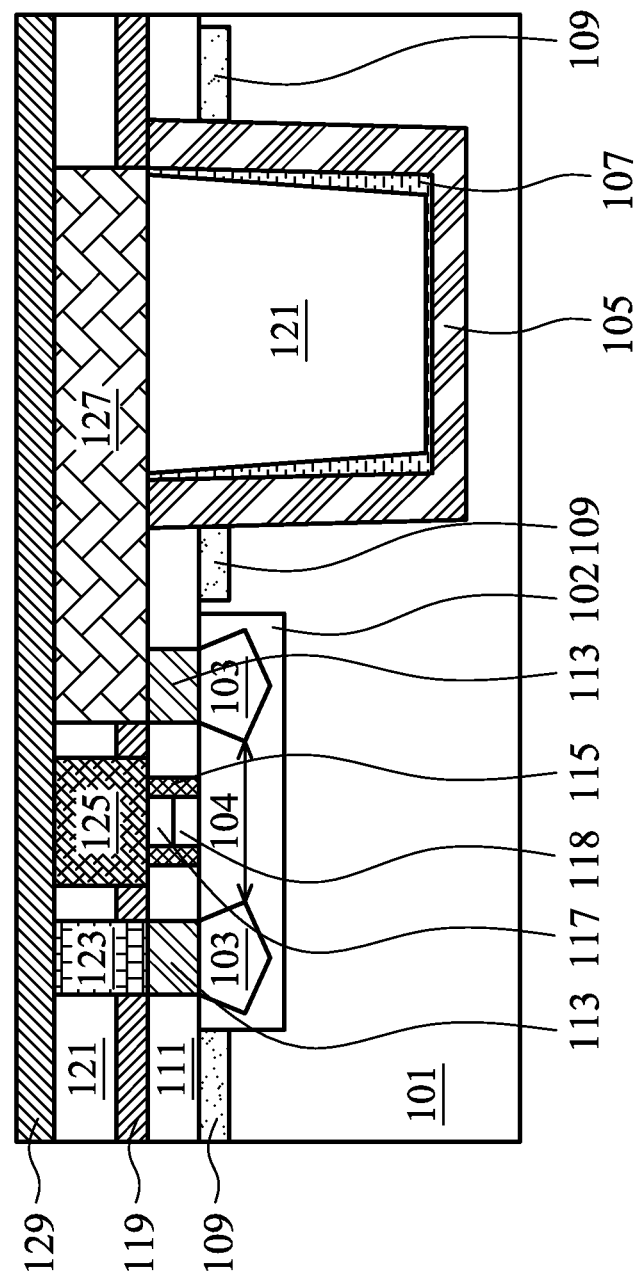

As illustrated in FIG. 3, an etching stop layer (ESL) 129 may be formed over the second ILD layer 121, covering the contacts 123, 125, and 127. The ESL 129 may be formed by a thin film growing technique. The ESL 129 may be made of an oxide material, a nitride material, or a carbon-based diamond material. The ESL 129 may be formed by a CVD process. The CVD process can be a LPCVD process or a PECVD process, as commonly known and used in the art.

Figure 4:
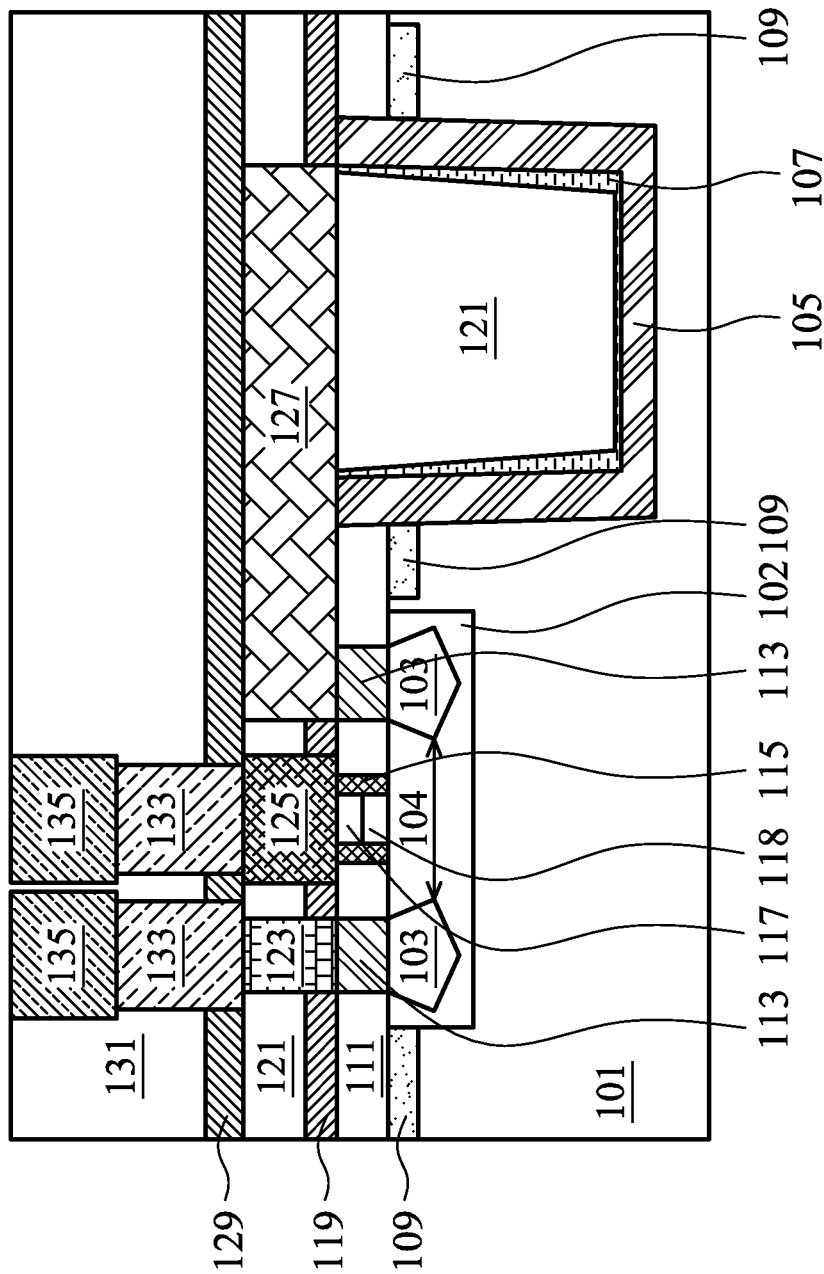

As illustrated in FIG. 4, a first metal layer $M_1$ may be formed over the ESL 129. The first metal layer $M_1$ may comprise a layer of conductive wiring comprising conductive lines 135 and vias 133. The conductive lines 135 and vias 133 are formed in an inter-metal dielectric (IMD) layer 131 which is over the ESL 129. The conductive lines 135 may be formed of any conductive material selected from a group consisting copper, tungsten, aluminum, silver, gold, a combination thereof, and/or the like. The IMD layer 131 may comprise a low dielectric constant or an extreme low dielectric constant (ELK) material, such as an oxide, SiO$_2$, BPSG, TEOS, SOG, USG, FSG, HDP oxide, or PETEOS. A planarization process, such as a CMP process, may be performed to planarize the IMD layer 131. The conductive lines 135 and vias 133 may be formed, e.g., using a plating and etching process or through a damascene or dual-damascene process, in which openings are etched into the corresponding dielectric layer and the openings are filled with a conductive material.

Figure 5:
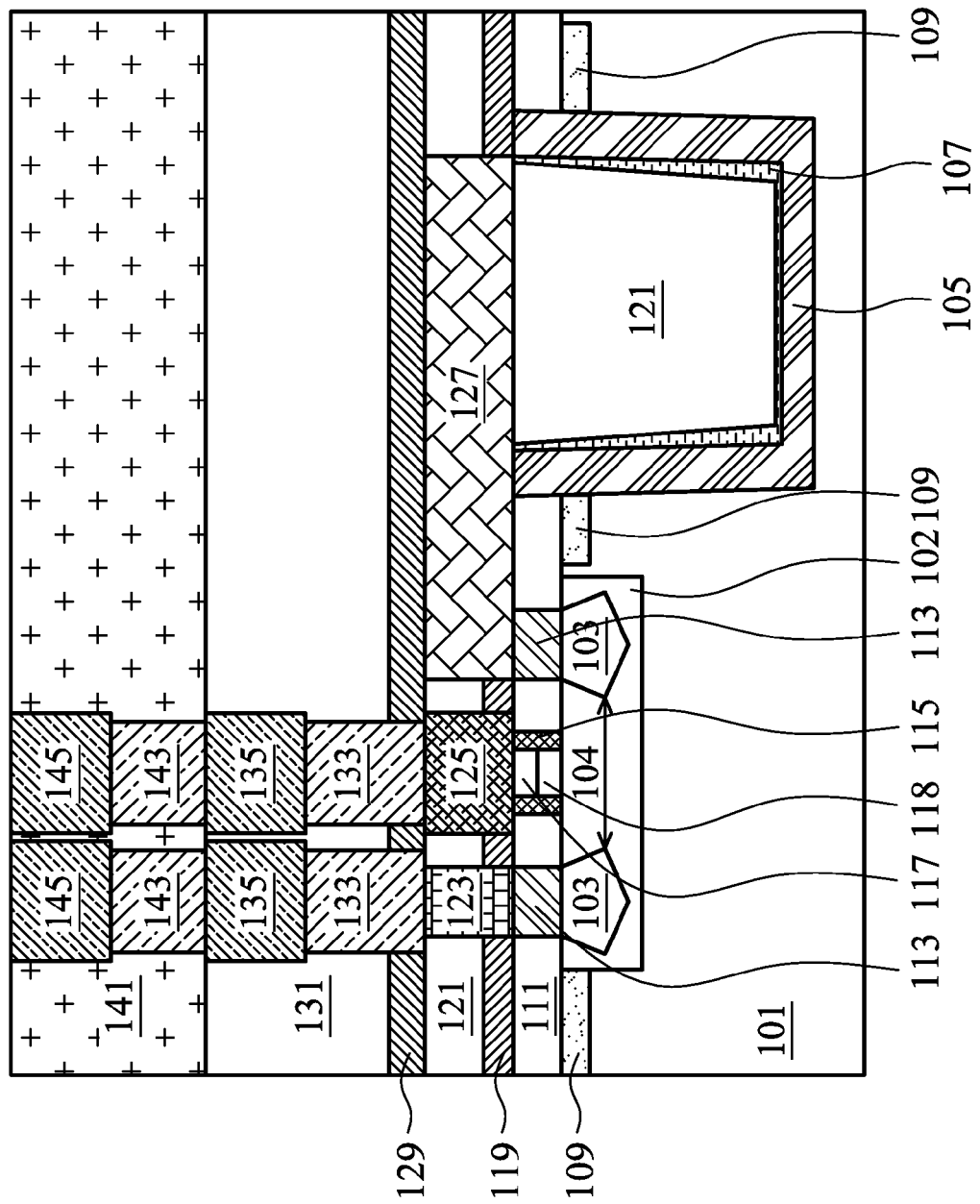

As illustrated in FIG. 5, a second metal layer M$_2$ may be formed over the first metal layer M$_1$. The second metal layer M$_2$ may comprise a layer of conductive wiring comprising conductive lines 145 and vias 143. The conductive lines 145 and vias 143 are formed in an IMD layer 141 which is over the IMD layer 131. The conductive lines 145 may be formed of any conductive material selected from a group consisting copper, tungsten, aluminum, silver, gold, a combination thereof, and/or the like. The IMD layer 141 may comprise a low dielectric constant or an extreme low dielectric constant (ELK) material, such as an oxide, SiO$_2$, BPSG, TEOS, SOG, USG, FSG, HDP oxide, or PETEOS. A planarization process, such as a CMP process, may be performed to planarize the IMD layer 141. The conductive lines 145 and vias 143 may be formed, e.g., using a plating and etching process or through a damascene or dual-damascene process, in which openings are etched into the corresponding dielectric layer and the openings are filled with a conductive material.

Generally, more metallization layers M$_3$-M$_n$ comprising conductive lines and vias to electrically couple individual devices may further be formed over the second metal layer M$_2$. The layers of conductive lines and vias may be formed in layers of IMD layers. In an embodiment, the metallization layers M$_3$-M$_n$ may be formed of copper, although other materials, such as tungsten, aluminum, gold, or the like, could alternatively be utilized. On top of the metallization layers, a passivation layer having external contacts may be formed. The external contacts may include an under-bump metallization (UBM) structure.

In one general aspect, embodiments described herein provide for a device including a transistor having a first source/drain region formed within a substrate, a second source/drain region formed within the substrate, and a gate structure overlying a channel region of the transistor, the channel region being between the first and second source/drain region. The device further includes a first contact over and electrically connected to the first source/drain region, the first contact being within a first dielectric layer over the substrate. The device also includes a through via extending through the first dielectric layer and into the substrate. A second contact is over the first contact and over the through via, the second contact being connected to the first contact and the through via. The second contact extends through a second dielectric layer and a third dielectric layer, the second dielectric layer being on the first dielectric layer and the third dielectric layer being on the second dielectric layer.

In another general aspect, embodiments described herein provide for a device including a substrate and a transistor formed at least partly within the substrate. The transistor includes a first source/drain region, a second source/drain region, and a gate formed on a top surface of the substrate. A first dielectric layer is on the top surface of the substrate. The gate is at least partially embedded within the first dielectric layer. The device further includes a through via extending through the first dielectric layer and extending into the substrate, the through via including a conductive feature and a liner layer surrounding the conductive feature. A contact is embedded within a second dielectric layer overlying first dielectric layer, the contact electrically contacting the first source/drain region and electrically contacting the through via. The device also includes a second dielectric layer overlying the first contact.

In yet another general aspect, embodiments described herein provide for a method including forming a first source/drain region in a substrate, depositing a first dielectric layer over the substrate, and forming in the first dielectric layer a first contact electrically contacting the first source/drain region. The method further includes etching the first dielectric layer and the substrate to form a trench extending through the first dielectric layer and into the substrate, and filling the trench with a conductor. The method yet further includes depositing a second dielectric layer over the through via, and forming in the second dielectric layer a second contact, the second contact electrically connecting the first contact and the conductor.

Although the present disclosure and its advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present disclosure processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a transistor having a first source/drain region formed within a substrate, a second source/drain region formed within the substrate, and a gate structure overlying a channel region of the transistor, the channel region being between the first and second source/drain region;
   a first contact over and electrically connected to the first source/drain region, the first contact being within a first dielectric layer over the substrate;
   a through via extending through the first dielectric layer and into the substrate; and
   a second contact over the first contact and over the through via, the second contact being connected to the first contact and the through via, the second contact extending through a second dielectric layer and a third dielectric layer, the second dielectric layer being on the first dielectric layer and the third dielectric layer being on the second dielectric layer, wherein the second contact extends over a shallow trench isolation feature.

2. The device of claim 1, wherein the first dielectric layer is a first inter dielectric layer (ILD) and the third dielectric layer is a second ILD, and wherein the second dielectric layer is a contact etch stop layer (CESL).

3. The device of claim 1, wherein the first source/drain region has a lattice constant that is different than a lattice constant of the substrate.

4. The device of claim 1, wherein the first dielectric layer comprises a material selected from the group consisting of an oxide, SiO2, borophosphosilicate glass (BPSG), TEOS, spin-on glass (SOG), undoped silicate glass (USG), fluorinated silicate glass (FSG), high-density plasma (HDP) oxide, and plasma-enhanced TEOS (PETEOS).

5. The device of claim 1, wherein the second dielectric layer imposes a strain upon the channel region.

6. The device of claim 1, wherein the through via comprises a liner and a barrier layer, both the liner and the barrier layer extending around the through via and extending through the first dielectric layer into the substrate.

7. The device of claim 2, wherein the first ILD layer and the second ILD layer comprise a material selected from a group consisting essentially of an oxide, SiO2, borophosphosilicate glass (BPSG), tetraethylorthosilicate (TEOS), spin-on glass (SOG), undoped silicate glass (USG), fluorinated silicate glass (FSG), high-density plasma (HDP) oxide, or plasma-enhanced TEOS (PETEOS).

8. A device, comprising:
a substrate;
a transistor formed at least partly within the substrate, the transistor including a first source/drain region, a second source/drain region, and a gate formed on a top surface of the substrate;
a first dielectric layer on the top surface of the substrate, wherein the gate is at least partially embedded within the first dielectric layer;
a through via extending through the first dielectric layer and extending into the substrate, the through via including a conductive feature and a liner layer surrounding the conductive feature;
a contact embedded within a second dielectric layer overlying the first dielectric layer, the contact electrically contacting the first source/drain region and electrically contacting the through via; and
an etch stop layer between the top surface of the substrate and the first dielectric layer.

9. The device of claim 8, wherein the etch stop layer imposes a strain upon a channel region of the transistor.

10. The device of claim 8, wherein the contact extends through the etch stop layer.

11. The device of claim 8, further comprising an isolation feature between the transistor and the through via.

12. The device of claim 11, wherein the contact extends over the isolation feature.

13. The device of claim 8, wherein the first source/drain region has a first lattice constant and the second source/drain region has the first lattice constant, and the substrate has a second lattice constant different than the first lattice constant.

14. The device of claim 8, further comprising an interconnect structure formed over the transistor and the through via, the interconnect structure electrically contacting the gate and the second source/drain region.

15. The device of claim 8, wherein the through via comprises:
a trench extending from a top surface of the first dielectric layer;
a liner lining the trench;
a barrier layer lining the liner; and
a conductor filling the trench.

16. A method comprising:
forming a first source/drain region in a substrate;
depositing an etch stop layer on the substrate;
depositing a first dielectric layer over the substrate and on the etch stop layer;
forming in the first dielectric layer a first contact electrically contacting the first source/drain region;
etching the first dielectric layer and the substrate to form a trench extending through the first dielectric layer and into the substrate;
filling the trench with a conductor;
depositing a second dielectric layer over the through via; and
forming in the second dielectric layer a second contact, the second contact electrically connecting the first contact and the conductor.

17. The method of claim 16, wherein the step of forming a first source/drain region in a substrate includes:
forming a recess in the substrate; and
epitaxially growing a strain material in the recess.

18. A device comprising:
a transistor having a first source/drain region formed within a substrate, a second source/drain region formed within the substrate, and a gate structure overlying a channel region of the transistor, the channel region being between the first and second source/drain region;
a first contact over and electrically connected to the first source/drain region, the first contact being within a first dielectric layer over the substrate;
a through via extending through the first dielectric layer and into the substrate; and
a second contact over the first contact and over the through via, the second contact being connected to the first contact and the through via, the second contact extending through a second dielectric layer and a third dielectric layer, the second dielectric layer being on the first dielectric layer and the third dielectric layer being on the second dielectric layer, wherein the second dielectric layer imposes a strain upon the channel region.

19. The device of claim 18, wherein the first source/drain region has a first lattice constant and the second source/drain region has the first lattice constant, and the substrate has a second lattice constant different than the first lattice constant.

20. The device of claim 18, further comprising an interconnect structure formed over the transistor and the through via, the interconnect structure electrically contacting the gate and the second source/drain region.

* * * * *